(12) United States Patent
Monk et al.

(10) Patent No.: US 8,310,829 B2
(45) Date of Patent: Nov. 13, 2012

(54) INTEGRATED COMPUTER EQUIPMENT CONTAINER AND COOLING UNIT

(75) Inventors: Brian Monk, St. Laurent (CA); Iiye Meldrum, Terrebonne (CA)

(73) Assignee: Carrier Corporation, Farmington, CT (US)

( * ) Notice: Subject to any disclaimer, the term of this patent is extended or adjusted under 35 U.S.C. 154(b) by 237 days.

(21) Appl. No.: 12/990,793

(22) PCT Filed: Apr. 8, 2009

(86) PCT No.: PCT/US2009/039873
§ 371 (c)(1),
(2), (4) Date: Nov. 3, 2010

(87) PCT Pub. No.: WO2009/137215
PCT Pub. Date: Nov. 12, 2009

(65) Prior Publication Data
US 2011/0056651 A1 Mar. 10, 2011

Related U.S. Application Data

(60) Provisional application No. 61/050,502, filed on May 5, 2008.

(51) Int. Cl.
*H05K 7/20* (2006.01)
(52) U.S. Cl. ......... 361/696; 361/694; 361/695; 454/184
(58) Field of Classification Search ......... None
See application file for complete search history.

(56) References Cited

U.S. PATENT DOCUMENTS

| | | | |
|---|---|---|---|
| 4,911,317 A | 3/1990 | Schloesser et al. | |
| 6,822,859 B2 | 11/2004 | Coglitore et al. | |
| 7,278,273 B1 | 10/2007 | Whitted et al. | |
| 7,334,697 B2 | 2/2008 | Myers et al. | |
| 7,365,973 B2 * | 4/2008 | Rasmussen et al. | 361/694 |
| 7,511,960 B2 * | 3/2009 | Hillis et al. | 361/702 |
| 7,724,513 B2 * | 5/2010 | Coglitore et al. | 361/679.47 |
| 7,738,251 B2 * | 6/2010 | Clidaras et al. | 361/701 |
| 7,856,838 B2 * | 12/2010 | Hillis et al. | 62/259.2 |
| 8,046,896 B2 * | 11/2011 | Schmitt et al. | 29/469 |
| 8,047,904 B2 * | 11/2011 | Yates et al. | 454/118 |
| 2007/0163748 A1 | 7/2007 | Rasmussen et al. | |
| 2007/0167125 A1 | 7/2007 | Rasmussen et al. | |
| 2008/0064317 A1 | 3/2008 | Yates et al. | |
| 2008/0123288 A1 * | 5/2008 | Hillis | 361/687 |

FOREIGN PATENT DOCUMENTS

| | | |
|---|---|---|
| EP | 0941776 A1 | 9/1999 |
| EP | 1903849 A1 | 3/2008 |
| JP | 05308859 A | 11/1993 |
| KR | 20030072960 A | 9/2003 |

OTHER PUBLICATIONS

Reimer, Jeremy, The Power of Sun in a Big Blackbox, Published: Apr. 3, 2007.

(Continued)

*Primary Examiner* — Gregory Thompson
(74) *Attorney, Agent, or Firm* — Cantor Colburn LLP

(57) ABSTRACT

A shipping container having an interior and a plurality of electronic equipment modules disposed within the interior of the container is cooled by an air conditioning unit adapted to be disposed within the interior of the container. The electronic equipment may include computing equipment and electronic data storage equipment.

15 Claims, 5 Drawing Sheets

OTHER PUBLICATIONS

Sensors Indicate Everything Functioning Normally, Captain, Apr. 28, 2008, http://arstechnica.com/hardware/news/2007/04/proiect-blackbox.ars/2, 3 pgs.

Rackable Systems Ice Cube, Modular Data Center, High Density, High Efficiency Mobile Computing, Rackable Systems, http://www.silicongraphics.net/pdfs/rs/icecube_datasheet.pdf, 2 pgs.

International Search Report and Written Opinion of the International Searching Authority, Mailed, Nov. 10, 2009, 6 pgs.

International Patent Application No. PCT/US09/39873, Filed: Apr. 8, 2009, Inventors: Brian Monk, Ilye Meldrum.

U.S. Appl. No. 61/050,502, filed May 5, 2008, Inventors: Brian Monk, Ilye Meldrum.

* cited by examiner

INTEGRATED COMPUTER EQUIPMENT CONTAINER AND COOLING UNIT

FIELD OF THE INVENTION

This invention relates generally to transportable modular computer and information technology equipment centers, more particularly, to a transportable modular computer and information technology center equipped having a cooling unit integrated therewith.

BACKGROUND OF THE INVENTION

Portable modular data centers are increasing being used to provide additional computing and electronic storage data capability without the cost and time delay associated with the construction of a stationary data center. Such modular data centers typically house a plurality of electronic modules, either rack-mounted or shelf-mounted, within a transportable container. The electronic modules may be disposed on both sides of a central aisle extending the length of the container so that humans may access the equipment. Examples of the electronic modules include computer processors, storage modules such as random access memory, disc drives, compact discs, video disks and other computer equipment and electronic information storage devices. The transportable container may be an intermodal shipping container capable of being transported by truck, by rail car or by ship, or even by plane. To facilitate global portability, the container may conform to International Standard Organization (ISO) container manufacturing standards.

For example, U.S. Pat. No. 7,278,273 discloses a modular data center housed in an ISO compliant intermodal shipping container. The modular data center includes at least one computing module including a shipping container and a plurality of computing systems mounted on racks or shelves within the shipping container and configured to be shipped and operated within the shipping container. The modular data center also includes an additional shipping container housing a temperature control system for providing chilled air to one or more of the containers housing the computer modules.

The multitude of electronic modules disposed on racks or shelves housed within a data center enclosure collectively generate a significant amount of heat, for example between 200 kW and 400 kW of sensible (dry) heat, during operation. Release of this heat into, and subsequent accumulation of the heat in the environment within the enclosure results in temperatures that could adversely impact the performance, reliability and useful life of the electronic modules and components thereof. Therefore, it is desirable to remove the heat produced by the electronic modules from the environment within the data center enclosure. For example, U.S. Pat. No. 7,365,973 discloses a cooling system for a data center wherein chilled coolant from an external source, such as a chiller unit, is circulated through a plurality of cooling racks positioned at selected locations within the data center enclosure for cooling air within the enclosed environment by circulating that air via fans mounted in the cooling racks through heat exchangers, also mounted in the cooling racks, in heat exchange with the chilled coolant.

SUMMARY OF THE INVENTION

An air conditioning unit is adapted to be installed in a shipping container having an interior and a plurality of electronic equipment modules disposed within the interior of the container. The air conditioning unit includes a casing having dimensions sized to be disposed within the interior of the shipping container. The casing has a forward wall facing the plurality of electronic equipment modules and a first side wall extending perpendicularly to the forward wall, and defines an interior chamber. An air inlet is provided in the first side wall opening in flow communication to the interior chamber and an air outlet in the forward wall, which is perpendicular to the first side wall, opening in flow communication to the interior chamber. An air mover is disposed within the interior chamber. The air mover has an inlet in flow communication with the air inlet and an outlet in flow communication with the air outlet. A heat exchanger is disposed within the interior chamber upstream with respect to air flow of the air mover for cooling the air flow passing through the interior chamber. In an embodiment, a mist eliminator may be disposed within the interior chamber downstream with respect to air flow of the heat exchanger. The mist eliminator may include a steel mesh screen.

To facilitate the return of air flow from the interior of the container, the casing of the air conditioning unit has a width that is less than a corresponding width of the container whereby an air plenum is formed adjacent the first side wall of the casing of the air conditioning unit when the air conditioning unit is disposed within the container. In an embodiment, the air conditioning unit is disposed within an intermodal ISO container. In an embodiment, the ISO container has a width of about 8 feet and the casing of the air conditioning unit has a width of about 6 feet.

At least one flow balancing plate may disposed at the air inlet to the air conditioning unit upstream with respect to air flow of the heat exchanger for selectively distributing the air flow pass into the heat exchanger. In an embodiment, the perforated plate has a plurality of selectively sized and selectively arrayed openings therein. An air filter rack may be disposed at the air inlet to the air conditioning unit upstream with respect to air flow of the heat exchanger.

BRIEF DESCRIPTION OF THE DRAWINGS

For a further understanding of the invention, reference will be made to the following detailed description of the invention which is to be read in connection with the accompanying drawing, where.

DETAILED DESCRIPTION OF THE INVENTION

Figure 1:
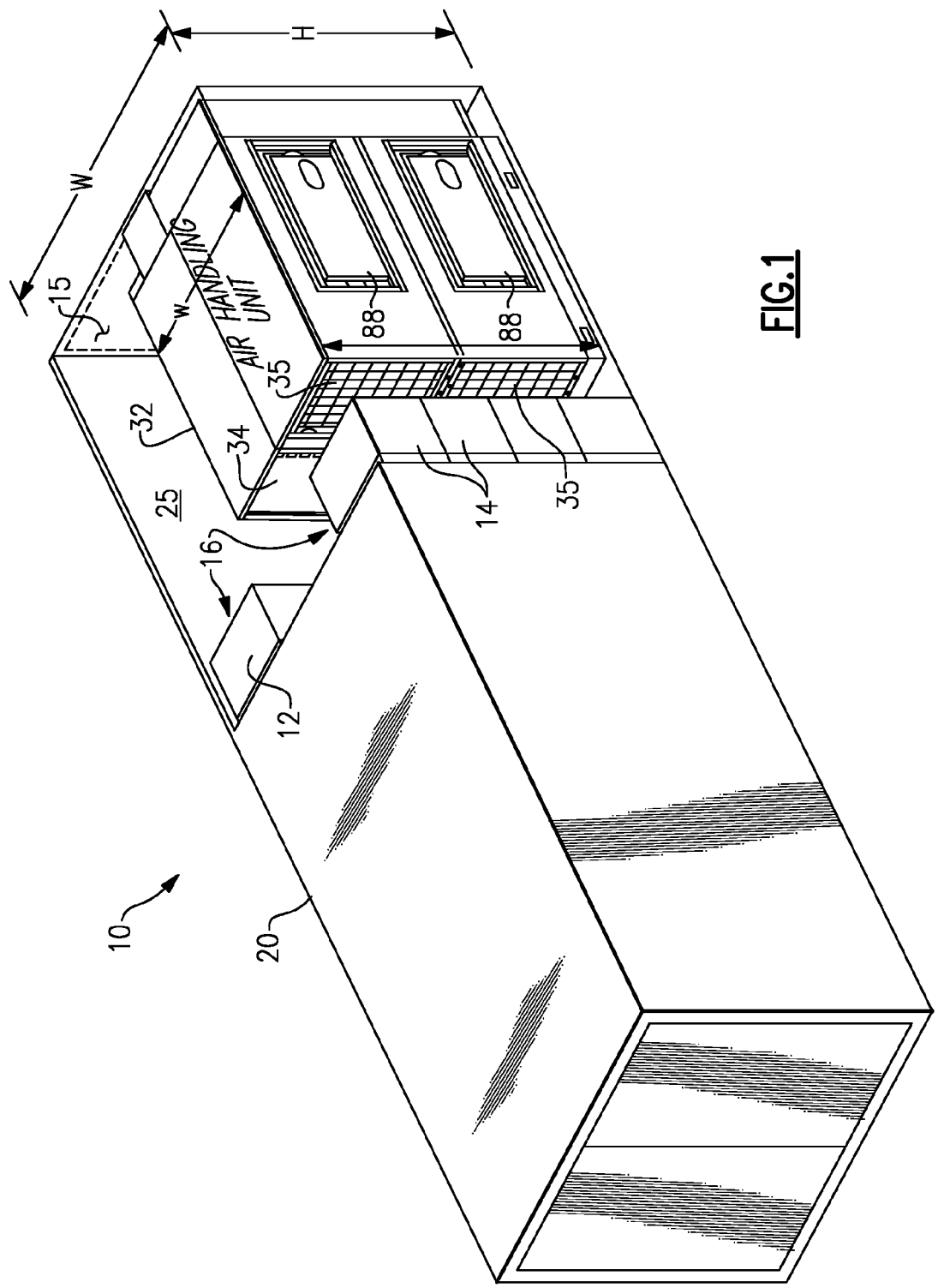
FIG. 1 is a perspective view, partly in section, of a modular data center and air conditioning unit housed in a shipping container.
Figure 2:
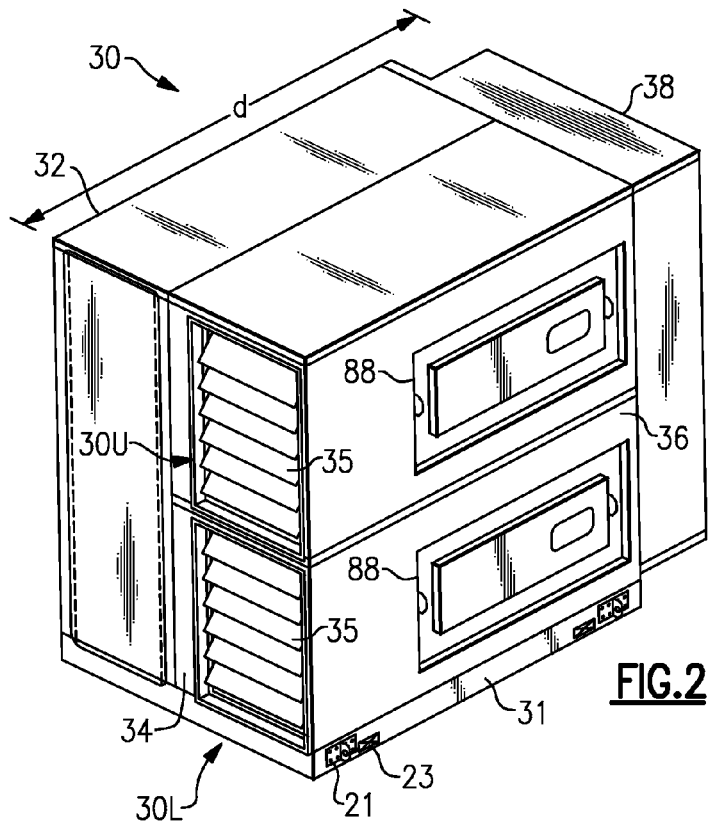
FIG. 2 is a first perspective view of an exemplary embodiment of the air conditioning unit shown in FIG. 1.
Figure 3:
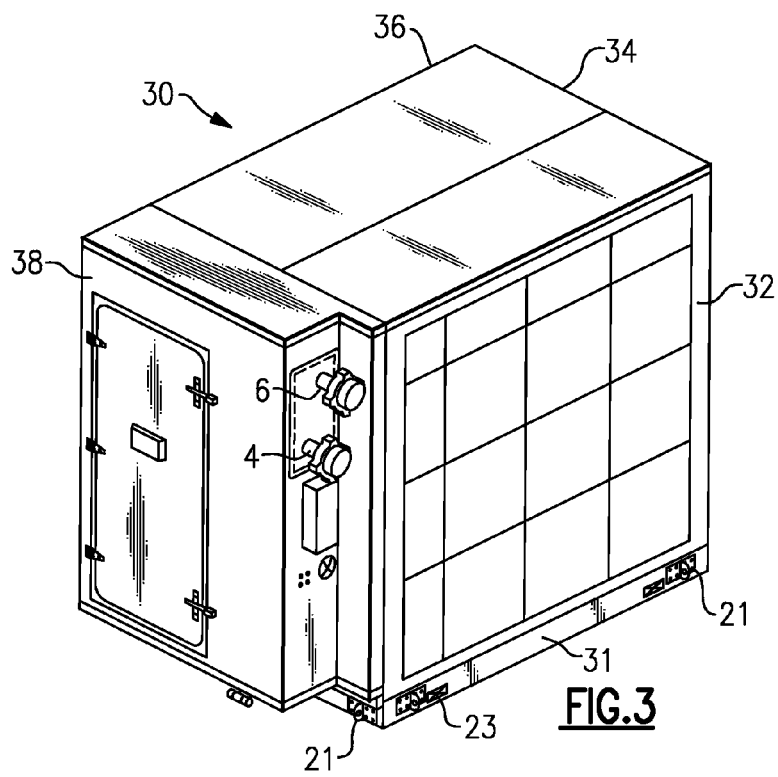
FIG. 3 is a second perspective view of an exemplary embodiment of the air conditioning unit shown in FIG. 1.

Referring initially to FIG. 1, there is depicted an exemplary embodiment of a modular data center 10 including a plurality of electronic equipment 12 disposed on shelves or racks housed in a shipping container 20 and an air conditioning unit (ACU) 30 housed in an aft portion of the shipping container 20. The electronic equipment may, for example include, but is not limited to, computer servers, computer processors, storage modules such as random access memory, disc drives, compact discs, video discs and other computer equipment and electronic information storage devices. The electronic equipment may be organized in electronic modules 14 that may be arranged in rows 16 disposed on both sides of a central aisle extending the length of the container or in any other desired arrangement permitting human access to the equipment. A container access door 15 may be provided in the aft wall of the container 20. Additional container access doors may be provided in other walls of the container if desired.

The shipping container 20 may be an intermodal shipping container capable of being transported by truck trailer, rail car or ship. In an embodiment, the container 20 may conform to International Standardization Organization (ISO) container manufacturing standards. Typically, ISO containers have a width of 8 feet, a height of 8½ feet, and a length of 40 feet, although other lengths, shorter and longer, are common However, containers of various other combinations of height, width and length may be used.

The ACU 30 has a casing having a first side wall 32 on the air inlet side of the ACU 30, a forward wall 34, a second side wall 36 opposite the first side wall, and an aft wall 38 opposite the forward wall 34, and defines an interior chamber 33 therein. The ACU casing has a height, h, compatible with the height, H, of the container 20 and a depth, d, substantially less than the length of the container 20. However, the ACU casing has a width, w, that is less than the width, W, of the container 20, such that when the ACU 30 is positioned within the interior of the container 20, a return air plenum 25 is formed between the air inlet side wall 32 of the ACU 30. As will be explained in further detail hereafter, to remove heat from the environment within the interior of the container 20, air from within the interior of the container 20 is drawn by air movers within the ACU 30 through the air plenum 25 into and through the ACU 30 and discharged therefrom through the louvered air outlets 35 in the forward wall 34 of the ACU 30. In passing through the ACU 30, the air passes in heat exchange relationship with a chilled coolant provided from a source (not shown) external of the container 20, whereby the air is cooled, typically to a temperature in the range of about 55° F. (about 12.8° C.) to about 75° F. (about 23.9° C.), and the heat removed from the air is transferred to the coolant and discharged externally of the environment within the interior of the container 20.

Referring now to FIGS. 2-6, in particular, the air conditioning unit 30 includes an upper ACU module 30U and a lower ACU module 30L disposed in a stacked array. Each ACU module includes an air mover 40, a heat exchanger 50 and a mist eliminator 60. The ACU module may also include an air filter 70. The stacked array of ACU modules 30U and 30L is, as noted previously, disposed in the aft portion of the container 20 with the air inlet side wall 32 of the ACU 30 facing the inlet air plenum 25 defined between the air inlet side 30 and the opposed inside surface of the container 20.

The air movers 40 of the upper and lower ACU modules 30U, 30L are disposed in the chamber 33 extending along the side 36 of the ACU 30 opposite the air inlet side wall 32 of the ACU 30. Each of the air movers 40 may include a plenum blower, such as, for example, a centrifugal fan, having its inlet in flow communication with the air inlet plenum 25 and its outlet in flow communication with a respective one of the air outlets 35 in the forward wall 34 of the ACU 30. Each plenum blower 40 may be driven by an electric motor 42 operatively associated therewith, either through a belt drive or a direct mechanical connection. Each electric motor 42 is driven via a motor drive 44, which may be fixed frequency drive or a variable frequency drive 44 associated with an electric service/supply panel 46 adapted to be connected to an external electric power source.

If driven by a variable frequency drive, each motor 42 may be a variable speed motor whereby the speed of the motor 42 may be selectively varied to vary the air flow capacity of its associated blower 40 to match the cooling demand. In this case, each plenum blower 40 may be sized to provide 100 percent of the required cooling capacity at maximum design demand. By over sizing each blower 40 and providing variable speed capability, air mover redundancy is provided. If one blower 40 can still meet maximum design cooling demand in the event that the other blower is out of operation. A shutoff damper assembly 48 may be provided in operative association with each of the plenum blowers 40 to permit a failed blower 40 to be isolated by closing the dampers of the shutoff damper assembly 48 to prevent air flow into the failed blower.

Each heat exchanger 50 is disposed within the ACU 30 so as to extend along the air inlet side 32 of the ACU 30, downstream with respect to air flow of the air inlet opening in the air inlet side wall 32 of the ACU 30 and upstream with respect to air flow of the plenum blower 40. Each heat exchanger 50 may include one or more heat exchanger tube banks arranged in parallel with respect to coolant flow through the tubes thereof and in series with respect to the flow of air over the tubes thereof. Each tube bank is connected in a conventional manner to an external supply of chilled coolant (not shown), such as, for example, but not limited to, chilled water from a chiller, or chilled refrigerant from a refrigerant condensing unit disposed external of the container 20, or chilled refrigerant cooled in an external water tower condenser. In operation, chilled coolant is pumped through the tubes of the heat exchanger 50 to cool and remove heat from air drawn by means of the plenum blowers 40 from within the compartment of the container 20 housing the electronic equipment 12, through the air plenum 25, over the tubes of the heat exchanger 50, and through the blowers 40 to be discharged therefrom through the louvered air outlets 35 back into the compartment of the container 20 housing the electronic equipment 12. In this manner, heat produced within the container 20 due to operation of the electronic equipment is removed from the closed environment within the interior of the container 20 and transferred to the coolant passing through the tubes of the heat exchanger 50. The warmed coolant having traversed the tubes of the heat exchanger 50 is returned to the external source of chilled coolant whereby the heat produced due to the operation of the electronic equipment is effectively rejected from the environment within the container 20.

A mist eliminator 60 may be disposed in the path of the air flow passing through the ACU 30. Moisture may enter the closed environment within the container 20 from the outside when humans make entry into the container 20 to access the electronic equipment housed therein. Additionally, moisture may condense out of the air within the closed environment when the air temperature therein drops, such as when the electronic equipment is shut-down, and therefore not generating heat, or the outside temperature drops significantly. Upon start-up of the ACU 30, this condense moisture will be re-entrained into the sir flow and will be removed therefrom before the electronic equipment is booted up. In the exemplary embodiment depicted in the drawing, a mist eliminator 60 is disposed downstream heat exchanger 50 with respect to air flow. Although most of the moisture in the air flow entering the heat exchanger 50 will condense on the outside of the tubes and drain into a condensate pan disposed beneath the heat exchanger 50, the mist eliminator 60 will collect those moisture droplets that may be carried over in the air flow passing from the heat exchanger 50. The mist eliminator 60 will also function to help balance airflow across the heat exchanger 50. The mist eliminator 60 may of conventional design. In an embodiment, the mist eliminator 60 comprises a steel mesh screen.

An air filter rack 70 having a framework supporting one or more air filters may be disposed at the air inlet in the air inlet side wall 32 of the casing of the ACU 30 upstream with respect to air flow of the heat exchanger 50. The air filters function to remove dust, dirt and other debris that may be entrained in the air flow from the compartment of the container 20 housing the electric equipment. Dirt, dust and other debris may be brought into the closed environment within the container 20 when humans enter therein to service, maintain or replace the electronic equipment 12 housed therein. The air filter rack 70 may be of conventional design.

Additionally, one or a plurality of flow balancing plates 80 may be disposed in the ACU 30 upstream of the heat exchanger 50 either in the filter rack 70 or external to the air inlet to the ACU 30. The flow balancing plates 80 may comprise perforated sheets having a plurality of opening therein arrayed in a desired pattern or non-perforated, solid sheets. Those skilled in the art will recognize that the distribution of air flow from the air plenum 25 into the heat exchanger 50 may be selectively adjusted to provide a uniform flow distribution across the face of the air inlet to the ACU 30 by selective sizing and arrangement of the openings in the perforated flow balancing plates 80. If desired, the flow balancing plates 80 may be disposed and supported in the supporting framework of air filter rack.

Figure 7:
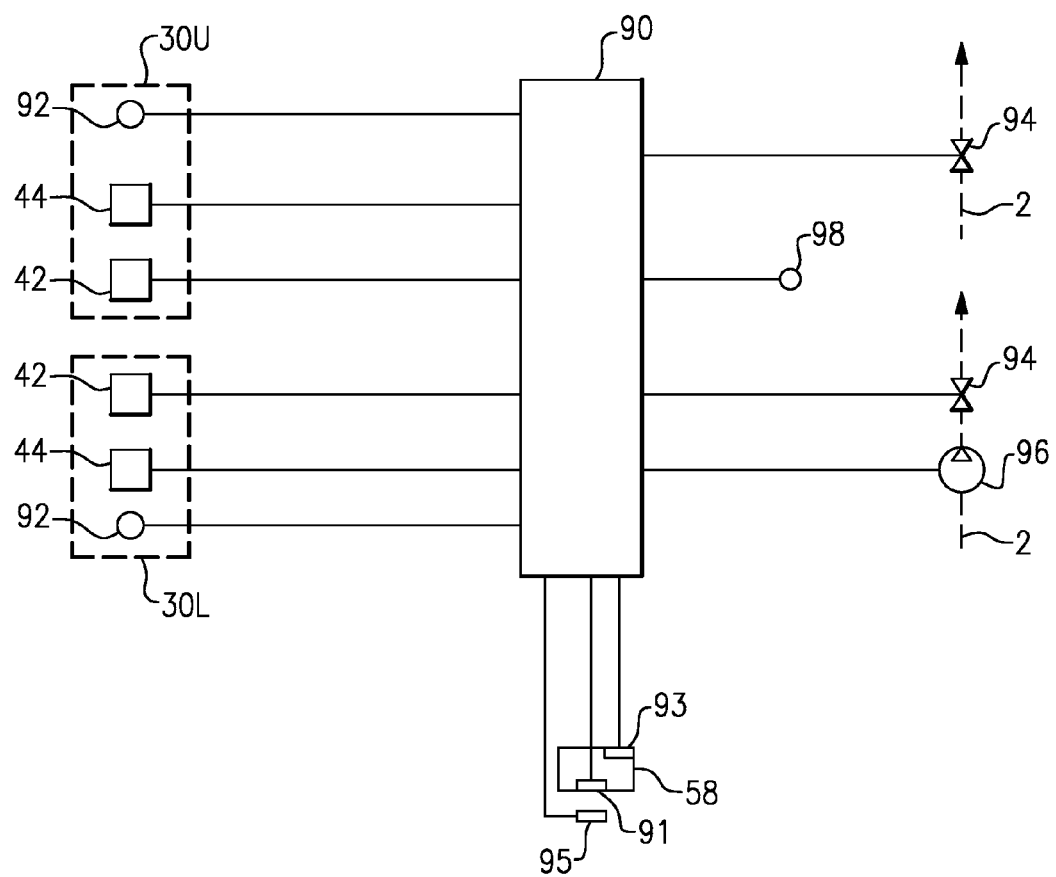
FIG. 7 is a schematic diagram of an exemplary control system associated with the air conditioning unit.

The ACU 30 may also include a controller 90 for controlling the operation of each of the air conditioning modules 30U and 30L. The controller 90 may be located within the electrical panel for ready access via the container doors 15 at the end of the container 20. Referring now to FIG. 7, in particular, the controller 90 monitors each of the respective discharge air temperature sensors 92 associated with the blowers 40. Each discharge air temperature sensor 92 may be located in the discharge duct of its associated blower 40. The controller 90 also monitors the temperature of the coolant entering and the temperature of the coolant leaving each of the heat exchangers 50 associated with the air conditioning modules 30U and 30L via coolant temperature sensors 98. The controller 90 also controls the variable frequency drives 44 to vary the speed of the fan motors 42 to vary the air flow delivered by each of the blowers 40. The controller 90 also controls the flow of coolant through the respective heat exchangers 50, for example by opening, closing or modulating a coolant flow control valve 94 disposed in the coolant supply line 2 to the respective heat exchangers 50 if the ACU 30 is associated with an external water chiller, or starting and stopping a compressor 96 in conjunction with modulating a refrigerant flow control valve 94 if the ACU 30 is associated with an external refrigerant condensing unit (in which case compressor may be located off-board the container) or a water tower condensing unit (which case the compressor may be located on-board). The controller 90 processes the discharge air and the coolant temperature measurement signals received and in response thereto varies the air flow and/or water flow as appropriate to maintain a desired discharge air temperature, typically in the range of about 55° F. (about 12.8° C.) to about 75° F. (about 23.9° C.), as well as to optimize the efficiency cooling system, including the external coolant supply device, for example a water chiller or a refrigerant condensing unit. It is to be understood that the controller 90 may vary the air flow delivered by the blower 40 and water flow through the heat exchanger of one of the modules 30U and 30L independently of the other of the modules 30U and 30L.

The controller 90 may have functional capability to shut down a blower 40 by deactivating its associated fan motor 42 in the event of a sudden drop or complete loss of static pressure, detected by a static pressure sensor (not shown) disposed in association with each blower, such as may occur as a result of a fan belt break or other component failure. The controller 90 may have functional capability to detect condensate build-up in a condensate drain pan 58 beneath each of the heat exchanger 50 and the capability to detect a water leak, either from the heat exchanger itself or from an overflowing condensate drain pan. To do so, the controller 90 may be programmed to monitor a plurality of sensors 91, 93, 95 for example electrical resistance sensor tapes, associated with a condensate drain pan disposed beneath each of the heat exchangers 50 and with the floor beneath the condensate drain pan. If an electrical resistance sensor tape becomes wet, the sensor transmits a signal to the controller 90 indicating the presence of water. For example, a first sensor tape 91 may be disposed in the bottom of drain pan 58 to detect if condensate is present in the drain pan, a second sensor 93 may be disposed near the top rim of the drain pan 58 to detect if the drain pan is filled with condensate, and a third sensor tape 95 may be disposed beneath the drain pan 58 to detect if the condensate has over flowed the drain pan or the heat exchanger has developed a coolant leak.

Figure 4:
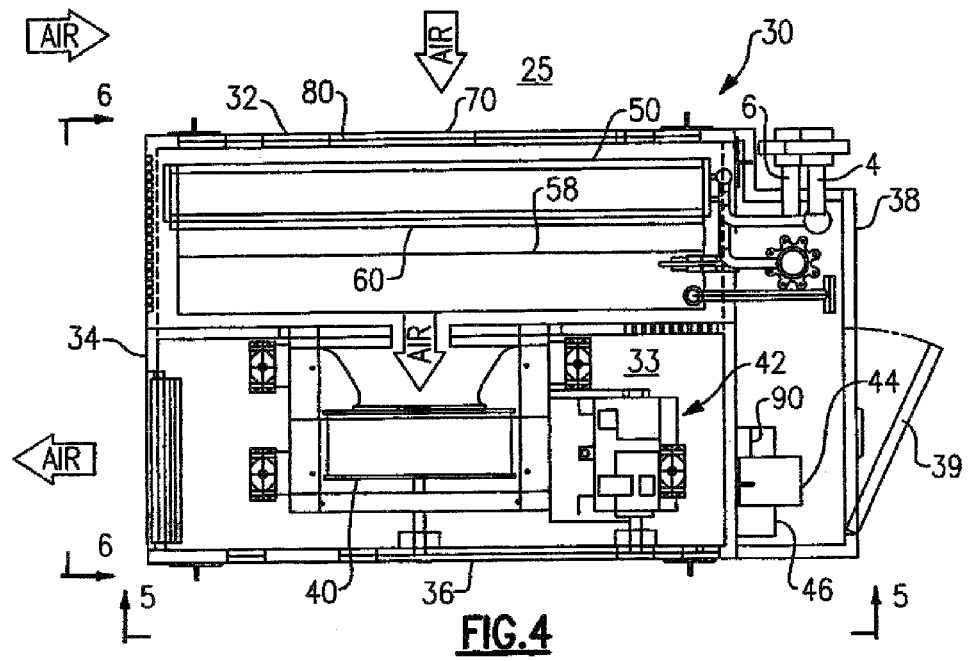
FIG. 4 is a plan view looking down upon the air conditioning unit of FIG. 2.
Figure 5:
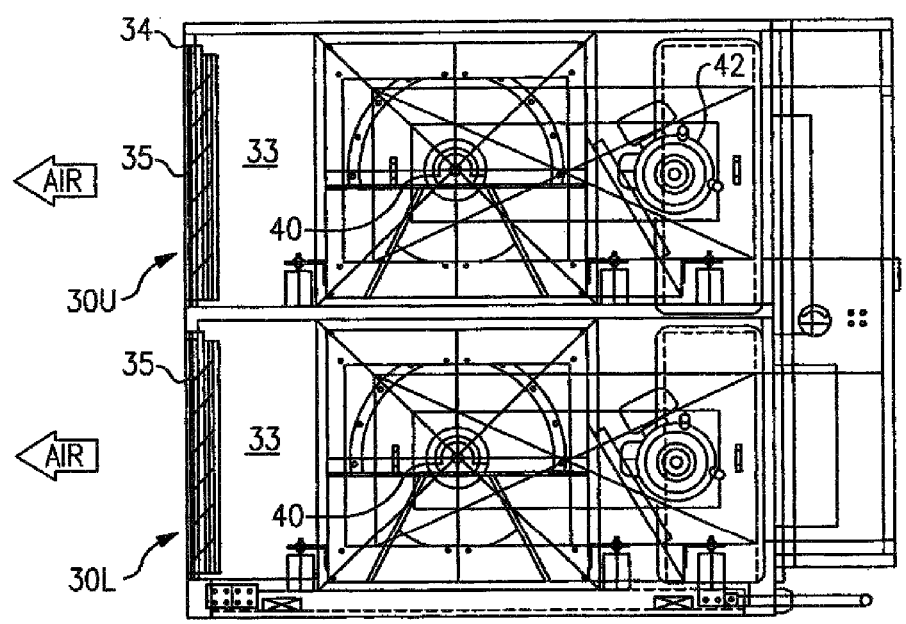
FIG. 5 is a side elevation view taken along line 5-5 of FIG. 4.
Figure 6:
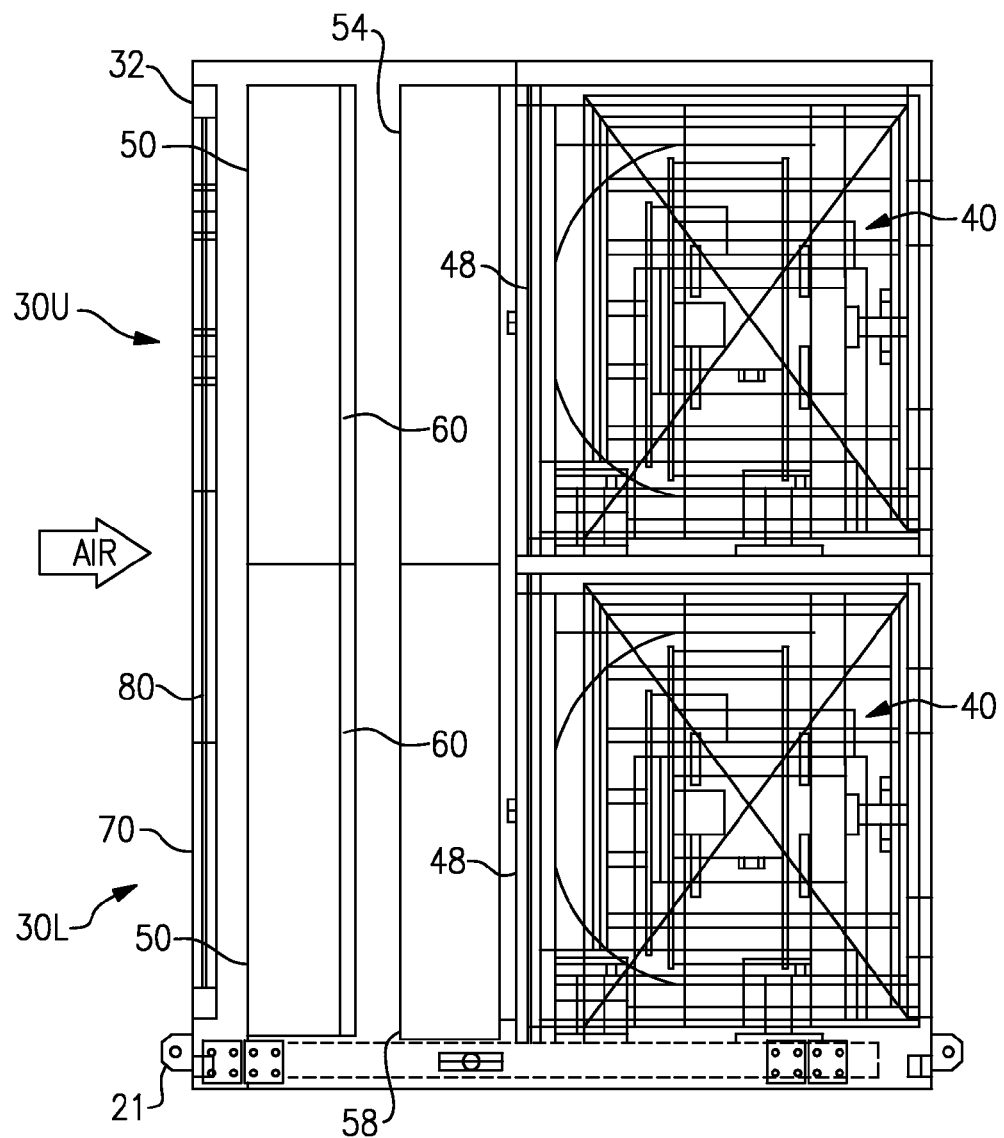
FIG. 6 is a side elevation view taken along line 6-6 of FIG. 4.

As noted previously, the air conditioning unit 30 is designed with a width, w, that is less than the width, W, of the container 20, such that when the ACU 30 is positioned within the interior of the container 20, a return air plenum 25 is formed between the air inlet side 32 of the ACU 30. Additionally, the air inlet side 32 of the ACU 30 and the air outlet side 34 of the ACU 30 are perpendicular to each other. Thus, as best seen in FIG. 4, air flow through the ACU 30 is therefore in a general U-shaped pattern. The ACU 30 draws in air flow at a high velocity, up to about 600 feet per minute, into the compartment housing the electronic equipment 12 along one side of the interior of the container 20, referred to as the "cold side", and receives return air at a high velocity, up to about 600 feet per minute, from the compartment housing the electronic equipment 12 along the other side of the interior of the container 20, referred to as the "warm side". In this manner, adequate cooling air is provided to all of the electronic equipment supported of racks or shelves within the interior of the container 20.

The air conditioning unit 30 is capable of delivering an amount of cooled air flow sufficient to meet maximum cooling demand for a modular data center disposed within a standard ISO shipping container while still fitting entirely within the interior of a standard ISO shipping container. The casing of the ACU 30 may have cutouts and offsets to recess coolant inlet and outlet connections 4 and 6. All protuberances from the ACU 30, such as door handles, door hinges, power connections and the like are within the footprint defined by the width and depth of the ACU 30. For example, the casing of the ACU 30 may have a height, h, of about 8¼ feet, a depth of about 9½ feet and an overall width of about 6 feet. When installed in a standard ISO container, due to the limited width of the ACU 30, the air plenum 25 formed between the air inlet side wall 32 of the casing of the ACU 30 and the facing wall of the container 20 will have a width of about 20 inches, which is large enough to also provide access with the air plenum 25 to service and replace the rack of air filters 70 and flow balancing plates 80.

Additionally, the ACU 30 may be equipped with lifting lugs 21 mounted to the base frame 31 of the ACU 30 for providing members to which a crane or other hoisting device may be attached to permit the ACU 30 to be lifted. The lifting lugs may be removable to facilitate final installation of the ACU 30 into the container 20. The ACU 30 may also be equipped with strap holes 23 and forklift points (not shown)

in the base frame 31 of the ACU 30 to facilitate securing the ACU 30 to a forklift truck and maneuvering the ACU 30 during final installation of the ACU 30 into the container 20. The ACU 30 may also include an access door 39 in the aft side wall 38 of the casing of the ACU 30, accessible via opening the container door 15, to provide human access to the plenum blowers 40 and associated fan motors 42, motor drives 44 and the electric supply panel 46. Additionally a pair of removable access panels 88 may be provided in the side wall 36 of the casing of the ACU 30 to permit access to the bearings, gearing and drive system of the plenum blowers 40 and associated fan motors 42. A corresponding access door 18 may be provided in the side of the container to permit access to the access panels 88.

The terminology used herein is for the purpose of description, not limitation. Specific structural and functional details disclosed herein are not to be interpreted as limiting, but merely as basis for teaching one skilled in the art to employ the present invention. While the present invention has been particularly shown and described with reference to the exemplary embodiments as illustrated in the drawing, it will be recognized by those skilled in the art that various modifications may be made without departing from the spirit and scope of the invention. Those skilled in the art will also recognize the equivalents that may be substituted for elements described with reference to the exemplary embodiments disclosed herein without departing from the scope of the present invention.

Therefore, it is intended that the present disclosure not be limited to the particular embodiment(s) disclosed, but that the disclosure will include all embodiments falling within the scope of the appended claims.

We claim:

1. An air conditioning unit adapted to be installed in a shipping container having an interior and a plurality of electronic equipment modules disposed within the interior of said container, said air conditioning unit comprising:
    a casing having dimensions sized to be disposed within the interior of the shipping container, said casing having a forward wall facing the plurality of electronic equipment modules and a first side wall extending perpendicularly to the forward wall, said casing defining an interior chamber;
    an air inlet in the first side wall opening in flow communication to the interior chamber;
    an air outlet in the forward wall opening in flow communication to the interior chamber;
    an air mover disposed within the interior chamber, said air mover having an inlet in flow communication with said air inlet and an outlet in flow communication with said air outlet; and
    a heat exchanger disposed within the interior chamber upstream with respect to air flow of said air mover for cooling the air flow passing through the interior chamber.

2. The air conditioning unit as recited in claim 1 further comprising at least one flow balancing plate disposed at said air inlet upstream with respect to air flow of said heat exchanger.

3. The air conditioning unit of claim 2 wherein said at least one flow balancing plate comprises a perforated plate having a plurality of selectively sized and selectively arrayed openings therein.

4. The air conditioning unit of claim 1 further comprising an air filter rack disposed at said air inlet upstream with respect to air flow of said heat exchanger.

5. The air conditioning unit of claim 1 further comprising a mist eliminator disposed within the interior chamber downstream with respect to air flow of said heat exchanger.

6. The air conditioning unit of claim 5 wherein said mist eliminator comprises a steel mesh screen.

7. The air conditioning unit of claim 1 wherein said heat exchanger comprises a plurality of heat exchanger tube banks.

8. The air conditioning unit of claim 1 wherein said casing of said air conditioning unit has a width that is less than a corresponding width of said container whereby an air plenum is formed adjacent the first side wall of said casing when said air conditioning unit is disposed within said container.

9. The air conditioning unit of claim 8 wherein the air conditioning unit is disposed within an intermodal ISO container.

10. The air conditioning unit of claim 9 wherein the ISO container has a width of about 8 feet and the casing of the air conditioning unit has a width of about 6 feet.

11. An air conditioning unit adapted to be installed in a shipping container having an interior and a plurality of electronic equipment modules disposed within the interior of said container, said air conditioning unit comprising:
    a casing having dimensions sized to be disposed within the interior of the shipping container, said casing having a forward wall facing the plurality of electronic equipment modules and a first side wall extending perpendicularly to the forward wall, said casing defining an interior chamber;
    an air inlet in the first side wall opening in flow communication to the interior chamber;
    an air outlet in the forward wall opening in flow communication to the interior chamber;
    an upper air conditioning module and a lower air conditioning module disposed the interior chamber, the lower air conditioning module disposed beneath the upper air conditioning module, each of the upper and lower air conditioning modules including an air mover having an inlet in flow communication with said air inlet and an outlet in flow communication with said air outlet and a heat exchanger disposed upstream with respect to air flow of said air mover for cooling the air flow passing through the interior chamber.

12. The air conditioning unit as recited in claim 11 wherein each of the upper and lower air conditioning modules has a capacity sufficient to meet 100% of the cooling demand.

13. The air conditioning unit as recited in claim 11 wherein the air mover of each of the upper and lower air conditioning modules comprises a variable speed blower driven by a variable frequency drive.

14. A modular computer equipment center comprising:
    a shipping container having an interior;
    a plurality of electronic equipment modules disposed within the interior of said container; and
    an air conditioning unit disposed in the interior of said container, said air conditioning unit having a casing having a forward wall facing the plurality of electronic equipment modules and a first side wall extending perpendicularly to the forward wall, said air conditioning unit having a width that is less than a corresponding width of said container whereby an air plenum is formed between the first side wall of said casing and a side wall of said container.

15. The modular computer equipment center as recited in claim 14 wherein said container comprises an intermodal ISO container.

* * * * *